United States Patent
Hada et al.

(10) Patent No.: US 7,544,460 B2
(45) Date of Patent: Jun. 9, 2009

(54) RESIST COMPOSITION, MULTILAYER BODY, AND METHOD FOR FORMING RESIST PATTERN

(75) Inventors: Hideo Hada, Kawasaki (JP); Kazuhito Sasaki, Kawasaki (JP); Satoshi Fujimura, Kawasaki (JP); Takeshi Iwai, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 325 days.

(21) Appl. No.: 10/563,705

(22) PCT Filed: Jul. 7, 2004

(86) PCT No.: PCT/JP2004/009997

§ 371 (c)(1),
(2), (4) Date: Jan. 5, 2006

(87) PCT Pub. No.: WO2005/006078

PCT Pub. Date: Jan. 20, 2005

(65) Prior Publication Data

US 2006/0154174 A1    Jul. 13, 2006

(30) Foreign Application Priority Data

Jul. 9, 2003    (JP) .............................. 2003-194256

(51) Int. Cl.
G03F 7/004    (2006.01)
G03F 7/30    (2006.01)
(52) U.S. Cl. .................... 430/270.1; 430/326; 430/330; 430/905; 430/910
(58) Field of Classification Search ............. 430/270.1, 430/905, 910, 326, 330
See application file for complete search history.

(56) References Cited

U.S. PATENT DOCUMENTS

| | | | |
|---|---|---|---|
| 5,968,713 A | 10/1999 | Nozaki et al. | |
| 6,004,720 A | 12/1999 | Takechi et al. | |
| 6,013,416 A | 1/2000 | Nozaki et al. | |
| 6,200,725 B1 | 3/2001 | Takechi et al. | |
| 6,239,231 B1 | 5/2001 | Fujishima et al. | |
| 6,280,898 B1 | 8/2001 | Hasegawa et al. | |
| 6,291,130 B1 | 9/2001 | Kodama et al. | |
| 6,329,125 B2 | 12/2001 | Takechi et al. | |
| 6,344,304 B1 | 2/2002 | Takechi et al. | |
| 6,348,297 B1 | 2/2002 | Uetani et al. | |
| 6,479,211 B1 | 11/2002 | Sato et al. | |
| 6,537,726 B2 | 3/2003 | Nakanishi et al. | |
| 6,555,289 B2 | 4/2003 | Sasaki et al. | |
| 6,579,659 B2 * | 6/2003 | Uetani et al. ............. | 430/270.1 |
| 6,656,659 B1 | 12/2003 | Nozaki et al. | |
| 6,703,178 B2 | 3/2004 | Chen et al. | |
| 6,753,124 B2 | 6/2004 | Nishimura et al. | |
| 6,858,370 B2 | 2/2005 | Kodama et al. | |
| 6,887,644 B1 | 5/2005 | Nozaki et al. | |
| 6,964,839 B1 | 11/2005 | Choi et al. | |
| 6,982,140 B2 | 1/2006 | Hada et al. | |
| 7,074,543 B2 | 7/2006 | Iwai et al. | |
| 7,252,924 B2 | 8/2007 | Yamanaka et al. | |
| 7,316,888 B2 * | 1/2008 | Iwai et al. ................. | 430/270.1 |
| 7,316,889 B2 * | 1/2008 | Iwai et al. ................. | 430/270.1 |
| 7,323,287 B2 * | 1/2008 | Iwai et al. ................. | 430/270.1 |
| 2002/0048720 A1 | 4/2002 | Sasaki et al. | |
| 2003/0087183 A1 | 5/2003 | Nishi et al. | |
| 2003/0113661 A1 | 6/2003 | Uetani et al. | |
| 2003/0175624 A1 | 9/2003 | Nozaki et al. | |
| 2004/0058269 A1 | 3/2004 | Hada et al. | |
| 2004/0110085 A1 | 6/2004 | Iwai et al. | |

FOREIGN PATENT DOCUMENTS

| | | |
|---|---|---|
| EP | 0982628 A2 | 3/2000 |
| EP | 1 452 922 A1 | 9/2004 |
| EP | 1 452 923 A1 | 9/2004 |
| EP | 1452917 A1 | 9/2004 |
| JP | 01-307228 | 12/1989 |
| JP | 2881969 | 2/1992 |
| JP | H04-039665 | 2/1992 |

(Continued)

OTHER PUBLICATIONS

Search report in corresponding European patent application No. 04.747463.0-2222 with date stamped letter from European patent associate evidencing receipt of search report by Shiga International Patent Office on Nov. 1, 2007.

(Continued)

*Primary Examiner*—John S Chu
(74) *Attorney, Agent, or Firm*—Knobbe, Martens, Olson & Bear, LLP

(57) ABSTRACT

A resist composition is disclosed that enables formation of a favorable resist pattern using a shrink process in which, following formation of the resist pattern, a treatment such as heating is used to narrow the resist pattern, and also disclosed are a laminate and a method for forming a resist pattern that use such a resist composition. This resist composition includes a resin component (A) that displays changed alkali solubility under the action of acid, and an acid generator component (B) that generates acid on exposure. The component (A) contains structural units derived from a (meth)acrylate ester, and exhibits a glass transition temperature that falls within a range from 120 to 170° C.

12 Claims, No Drawings

FOREIGN PATENT DOCUMENTS

| | | |
|---|---|---|
| JP | 04-364021 | 12/1992 |
| JP | H05-346668 | 12/1993 |
| JP | H10-319595 | 12/1998 |
| JP | HI1-0 12326 | 1/1999 |
| JP | 2000-019732 | 1/2000 |
| JP | 2000-13 7327 | 5/2000 |
| JP | 2001-296659 | 10/2000 |
| JP | 2000-330287 | 11/2000 |
| JP | 2000-338674 | 12/2000 |
| JP | 2001-060583 | 3/2001 |
| JP | 2001-188347 | 7/2001 |
| JP | 2002-40661 | 2/2002 |
| JP | 2002-162745 | 6/2002 |
| JP | 2002-296779 | 10/2002 |
| JP | 2003-043690 | 2/2003 |
| JP | 2003-107752 | 4/2003 |
| JP | 2003-122007 | 4/2003 |
| JP | 2003-131400 | 5/2003 |
| JP | 2003-142381 | 5/2003 |
| JP | 2003-149812 | 5/2003 |
| JP | 2003-345025 | 12/2003 |
| JP | 2004-101642 | 4/2004 |
| JP | 2004-302198 | 10/2004 |
| JP | 2004-302199 | 10/2004 |
| KR | 2000-0017485 | 3/2000 |
| KR | 2000-0077438 | 2/2007 |
| WO | WO 03-040831 A1 | 5/2003 |
| WO | WO 03/040832 A1 | 5/2003 |
| WO | WO 03/048861 A1 | 6/2003 |
| WO | WO 2004/051372 A2 | 6/2004 |

OTHER PUBLICATIONS

Office Action issued on Jun. 10, 2008, on the counterpart Japanese Patent Application No. 2003-194256.

Office Action dated Oct. 7, 2008 for the counterpart European Patent Application No. 08100840.1.

European Search Report issued Mar. 3, 2008 on the counterpart European Patent Application No. 08100840.1.

\* cited by examiner

RESIST COMPOSITION, MULTILAYER BODY, AND METHOD FOR FORMING RESIST PATTERN

This application is the U.S. National Phase under 35 U.S.C. §371 of International Application PCT/JP2004/009997, filed Jul. 7, 2004, which claims priority to Japanese Patent Application No. 2003-194256, filed Jul. 9, 2003. The International Application was published under PCT Article 21(2) in a language other than English.

TECHNICAL FIELD

The present invention relates to a resist composition that can be used favorably in a method for forming a resist pattern in which, following formation of a resist pattern on a support, a shrink process is conducted wherein a water-soluble coating formed from a water-soluble coating formation agent containing a water-soluble polymer is provided on top of the resist pattern, and this water-soluble coating is then shrunk by heating, thereby narrowing the spacing of the resist pattern, and also relates to a laminate and a method for forming a resist pattern that use such a resist composition.

BACKGROUND ART

In recent years, in the production of semiconductor elements and liquid crystal display elements, advances in lithography techniques have lead to rapid progress in the field of miniaturization. Typically, these miniaturization techniques involve shortening the wavelength of the exposure light source. Until recently, ultraviolet radiation such as g-lines and i-lines have been used as the exposure light source, but recently, KrF excimer lasers (248 nm) have been introduced, and even ArF excimer lasers (193 nm) are now starting to be used.

One example of a resist material that satisfies the high resolution conditions required to enable reproduction of a pattern of minute dimensions is a chemically amplified resist composition, which includes a base resin that displays changed alkali solubility under the action of acid, and an acid generator that generates acid on exposure, dissolved in an organic solvent (for example, see patent reference 1).

In KrF excimer laser lithography, polyhydroxystyrenes or derivatives thereof in which the hydroxyl groups have been protected with acid dissociable, dissolution inhibiting groups, which exhibit a high level of transparency relative to a KrF excimer laser (248 nm), have typically been used as the base resin of chemically amplified resists. However, these resins exhibit unsatisfactory transparency near 193 nm.

As a result, ArF resists with a variety of different compositions are now being proposed, and in these resists, the most common ArF resist base resins are (meth)acrylic resins, which exhibit a high level of transparency in the region of 193 nm.

In recent years, the rate of miniaturization has accelerated, and nowadays, resolutions capable of forming line and space patterns of no more than 100 nm and isolated patterns of no more than 70 nm are being sought. As a result, in addition to the research and development being conducted on resist materials to enable ultra-miniaturization, research is also being conducted on pattern formation methods, to develop techniques capable of overcoming the resolution limits of resist materials.

An example of one such miniaturization technique that has been recently proposed is the thermal flow process, wherein a resist pattern is formed using normal lithography techniques, and the resist pattern is then subjected to heat treatment to reduce the pattern size. Thermal flow is a method in which following formation of a resist pattern using photolithography techniques, the resist pattern is heated and softened, causing the pattern to flow towards the gaps in the pattern, thus reducing the resist pattern size, that is, the size of the portions where the resist is not formed (such as the hole diameter in a hole pattern, or the space width in a line and space (L&S) pattern).

For example, the patent reference 2 discloses a method for forming a fine pattern in which a resist pattern is formed on a substrate, heat treatment is conducted, and the cross-sectional shape of the resist pattern is changed from a rectangular shape to a semicircular shape, thereby increasing the length of the pattern base and forming a finer pattern.

Furthermore, the patent reference 3 discloses a method for forming a fine pattern in which following formation of a resist pattern, heating is conducted to approximately the softening temperature of the resist, and fluidization of the resist causes a narrowing of the pattern size.

Furthermore, the patent references 4 and 5 disclose methods that differ from the aforementioned thermal flow processes, wherein heating is used to shrink a water-soluble resin, thereby forming a finer pattern.

Patent Reference 1:
Japanese Unexamined Patent Application, First Publication No. 2002-162745
Patent Reference 2:
Japanese Unexamined Patent Application, First Publication No. Hei 1-307228
Patent Reference 3:
Japanese Unexamined Patent Application, First Publication No. Hei 4-364021
Patent Reference 4:
Japanese Unexamined Patent Application, First Publication No. 2003-107752
Patent Reference 5:
Japanese Unexamined Patent Application, First Publication No. 2003-142381

However, in this type of thermal flow process, because the resist is caused to flow by heating conducted after the developing step, a problem arises in that the cross-sectional shape of the side walls of the resist pattern are prone to collapse, causing a deterioration in the verticalness (rectangularity) of the pattern.

Because a shrink process does not cause the resist to flow, a resist pattern can be produced that exhibits more favorable rectangularity than that from a thermal flow process. However, until now, the resists used in shrink processes have been i-line or KrF resists, and if the same shrink processes are used with resists that include a resin containing structural units derived from methacrylate ester units as the primary units, such as the resins used within ArF resists, then the merits of the shrink process in enabling miniaturization of the resist pattern are difficult to achieve.

Accordingly, an object of the present invention is to provide a resist composition that enables formation of a favorable resist pattern using a shrink process in which following formation of the resist pattern, a treatment such as heating is used to narrow the resist pattern, and also to provide a laminate and a method for forming a resist pattern that use such a resist composition.

DISCLOSURE OF INVENTION

As a result of investigations aimed at improving the fine resolution of resist patterns, the inventors of the present invention discovered that the above object could be achieved by using a resist composition that includes, as a base resin, a (meth)acrylic resin with a Tg value that falls within a specific range, and they were hence able to complete the present invention.

In other words, a first aspect of the present invention for achieving the above object is a resist composition, which includes a resin component (A) that displays changed alkali solubility under the action of acid and an acid generator component (B) that generates acid on exposure, and which is used in a shrink process that includes the steps of: providing a resist layer formed from the resist composition on top of a support, forming a resist pattern in the resist layer, providing a water-soluble coating formed from a water-soluble coating formation agent containing a water-soluble polymer on top of the resist pattern, and shrinking this water-soluble coating by heating, thereby narrowing the spacing of the resist pattern, wherein the component (A) is a resin that contains structural units derived from a (meth)acrylate ester, and has a glass transition temperature that falls within a range from 120 to 170° C.

A second aspect of the present invention for achieving the above object is a laminate, in which a resist pattern formed from a resist composition of the first aspect of the present invention, and a water-soluble coating formed from a water-soluble coating formation agent containing a water-soluble polymer are laminated on top of a support.

A third aspect of the present invention for achieving the above object is a method for forming a resist pattern that includes the steps of: providing a resist layer formed from a resist composition on top of a support, forming a resist pattern in the resist layer, and then conducting a shrink process by providing a water-soluble coating formed from a water-soluble coating formation agent containing a water-soluble polymer on top of the resist pattern, and shrinking this water-soluble coating by heating, thereby narrowing the spacing of the resist pattern, wherein a resist composition according to the first aspect above is used as the resist composition.

BEST MODE FOR CARRYING OUT THE INVENTION

As follows is a description of embodiments of the present invention.

In this description, the term "(meth)acrylic acid" is a generic term that includes both methacrylic acid and acrylic acid. Similarly, the term "(meth)acrylate" is a generic term that includes both methacrylate and acrylate. The term "structural unit" refers to a monomer unit that contributes to the formation of a polymer. The term "structural unit derived from a (meth)acrylate ester" is also referred to as a (meth) acrylate structural unit. The term "lactone unit" refers to a group in which one hydrogen atom has been removed from a monocyclic or polycyclic lactone.

<<Method for Forming Resist Pattern using Shrink Process, and Laminate>>

In response to the aforementioned problem of loss of rectangularity within thermal flow processes, the applicants of the present invention have proposed a shrink process that includes the steps of: forming a resist pattern on top of a support, forming a water-soluble coating on top of the resist pattern, and then shrinking this water-soluble coating by heat treatment, using the heat shrinkage effect to narrow the resist pattern size (see patent reference 4 and Japanese Unpublished Patent Application No. 2002-080517 and the like).

The shrink process is a method in which, following the covering of a resist pattern with a water-soluble coating, this water-soluble coating is shrunk by heat treatment, and this heat shrinkage action is used to narrow the spacing of the resist pattern.

In a thermal flow process, because the resist is made to flow, not only does the rectangularity deteriorate, but the degree of narrowing is pitch dependent, meaning when a plurality of patterns is formed on a single substrate, the variation in spacing (the pitch) between adjacent patterns causes the degree of narrowing to differ for each pattern, leading to different pattern sizes on the same substrate. However, because a shrink process does not cause the resist to flow, a resist pattern of more favorable rectangularity than a thermal flow process can be obtained. The pitch dependency is also favorable.

A resist composition of the present invention is ideal for use within a method for forming a resist pattern in which a shrink process is conducted following formation of the resist pattern, and can also be used favorably in a laminate in which a resist pattern formed from a resist composition, and a water-soluble coating formed from a water-soluble coating formation agent containing a water-soluble polymer are laminated on top of a support.

A method for forming a resist pattern that includes the conducting of a shrink process can be conducted, for example, in the manner described below.

First, a resist composition is applied to the surface of a support such as a silicon wafer using a spinner or the like, and a prebake is then conducted under temperature conditions of 80 to 150° C., for a period of 40 to 120 seconds, and preferably for 60 to 90 seconds, thereby forming a resist film. The resist film is then selectively exposed with an ArF excimer laser through a desired mask pattern using, for example, an ArF exposure apparatus, and PEB (post exposure baking) is then conducted under temperature conditions of 80 to 150° C. for a period of 40 to 120 seconds, and preferably for 60 to 90 seconds. Subsequently, developing is conducted using an alkali developing solution such as an aqueous solution of tetramethylammonium hydroxide with a concentration of 0.05 to 10% by weight, and preferably from 0.05 to 3% by weight. In this manner, a resist pattern that is faithful to the mask pattern can be obtained.

There are no particular restrictions on the support, and conventional materials can be used, including the types of substrates used for electronic componentry, and substrates with a predetermined wiring pattern formed thereon.

Specific examples of the substrate include metal substrates such as silicon wafers, copper, chrome, steel or aluminum, as well as glass substrates.

Examples of suitable materials for the wiring pattern include copper, solder, chrome, aluminum, nickel and gold.

An organic or inorganic anti-reflective film may also be provided between the support and the applied layer of the resist composition.

As the light source used in the exposure process, although ArF excimer lasers are particularly applicable, other types of radiation, including radiation of longer wavelength such as KrF excimer lasers, and radiation of shorter wavelength such as $F_2$ lasers, EUV (extreme ultraviolet radiation), VUV (vacuum ultraviolet radiation), electron beams, X-rays and soft X-rays can also be used.

Subsequently, following developing of the resist pattern, the shrink process is conducted to narrow the resist pattern size.

In the shrink process, first, a water-soluble coating formation agent containing a water-soluble polymer is applied to the surface of the resist pattern formed on the support, preferably forming a laminate in which the water-soluble coating covers the entire surface of the resist pattern.

Following application of the water-soluble coating formation agent, the support may be subjected to a prebake at a temperature of 80 to 100° C. for a period of 30 to 90 seconds.

The application of the water-soluble coating formation agent can be conducted using a known method used in the formation of conventional resist layers and the like. In other words, an aqueous solution of the coating formation agent can be applied to the resist pattern using a spinner or the like.

The thickness of the water-soluble coating is preferably either similar to the height of the photoresist pattern, or of a height sufficient to cover the pattern, and is typically within a range from 0.1 to 0.5 μm.

Subsequently, the thus obtained laminate is subjected to heat treatment, causing the water-soluble coating to undergo heat shrinkage. As a result of this heat shrinkage action on the water-soluble coating, the side walls of the resist patterns in contact with the water-soluble coating are pulled together, thereby narrowing the spacing (between patterns) of the resist-free portions within the resist pattern. As a result, the pattern can be reduced in size.

In the shrink process, the heat treatment is conducted at a heating temperature and for a heating period that cause shrinkage of the water-soluble coating, but do not cause the type of fluidization of the resist that occurs in conventional thermal flow processes.

The heating temperature is preferably set to a value that is from 3 to 50° C. lower, and even more preferably 5 to 30° C. lower, than the temperature (the fluidization temperature) at which heat treatment starts to causes spontaneous flow of the resist pattern formed on the support. Moreover, if the shrinking performance of the water-soluble coating is also taken into consideration, then a preferred heat treatment is typically conducted within a temperature range from 80 to 160° C., and preferably from 130 to 160° C.

The fluidization temperature of a resist pattern varies depending on the nature and blend quantities of the components contained within the resist composition.

The heating time varies depending on the heating temperature, but is typically within a range from 30 to 90 seconds.

Subsequently, the water-soluble coating remaining on the pattern is removed by washing with an aqueous solvent, and preferably with pure water, for 10 to 60 seconds. The water-soluble coating is easily removed by washing with water, and is able to be completely removed from the support and the resist pattern.

In the method for forming a resist pattern and the laminate according to the present invention, a resist composition of the present invention, which is described below, is used within the resist pattern formation method and the laminate described above.

<<Resist Composition>>

Provided the resist composition of the present invention includes a component (A) and a component (B), wherein the component (A) contains (meth)acrylate structural units and has a glass transition temperature within a range from 120 to 170° C., then the composition may be either a negative composition or a positive composition.

Those cases in which the component (A) contains an alkali-soluble resin and a cross-linking agent are so-called negative compositions, whereas those cases in which the component (A) contains a resin that can be converted to an alkali-soluble form are so-called positive compositions. The resist composition of the present invention is preferably a positive composition.

In the case of a negative composition, when acid is generated from the component (B) during the exposure step during the resist pattern formation, the action of this acid causes cross-linking to occur between the component (A) and the cross-linking agent, causing the resin to become insoluble in alkali. As the cross-linking agent, an amino-based cross-linking agent such as a melamine resin with methylol groups or alkoxylmethyl groups, urea resin, or glycoluril can be used.

Component (A)

The present invention uses a resin that contains (meth)acrylate structural units, and has a glass transition temperature (Tg) within a range from 120 to 170° C., and preferably from 130 to 160° C., and even more preferably from 140 to 160° C., as the aforementioned component (A).

A resist composition of the present invention, containing a resin with a Tg value that falls within this type of temperature range, is ideal for the type of shrink process described above. Resins for which the Tg value exceeds the above range, or resins for which the decomposition point is lower than the Tg value cannot be used.

It is thought that the reason a resin with a Tg value from 120 to 170° C. is ideal for use within a shrink process is as described below.

Namely, when a resist composition is used for forming a resist pattern, generally a prebake and post exposure baking (PEB) are conducted. During the prebake, heating must be conducted at a temperature of 80 to 150° C. in order to volatilize the organic solvent and the like contained within the resist composition, thereby enabling formation of the resist layer. During PEB, heating must be conducted at a temperature of 80 to 150° C. in order to ensure generation of an adequate quantity of acid from the component (B). However, if the Tg value of the base resin is less than 120° C., then the resist obtained using the resist composition containing that base resin exhibits a low fluidization temperature, and a reduced level of heat resistance. As a result, it is thought that because the heating of the prebake and PEB steps cause a softening of the resist, a resist pattern with favorable rectangularity cannot be obtained. Accordingly, forming a resist pattern with favorable rectangularity becomes problematic.

In contrast, a shrink process is a method in which sections of the resist pattern are pulled together, thereby narrowing the pattern size, by shrinking a water-soluble coating laminated on top of the resist pattern. In order to enable pulling and movement of the resist, the resist must be softened to a certain level that still precludes flow of the resist. Consequently, in a shrink process, heat treatment is preferably conducted at a temperature that is slightly lower than the fluidization temperature for the resist. As a result, resists with higher fluidization temperatures can be subjected to higher heat treatment temperatures.

However, the upper limit for the heat resistance of the water-soluble polymer contained within the water-soluble coating is approximately 170° C., and if heating is conducted at a higher temperature than this, then the shrinking performance deteriorates, uniform shrinkage becomes impossible, and self cross-linking occurs. As a result, a variety of problems arise, including an inability to achieve a satisfactory narrowing of the pattern size, the appearance of irregularities in the degree of narrowing across a plurality of resist patterns formed on a single substrate, making formation of a uniform shape impossible, and the existence of residual water-soluble coating on portions of the resist pattern following removal of the water-soluble coating by washing with water.

Based on investigations by the inventors of the present invention it was discovered that with the type of resins typically used as the base resin of conventional ArF resists, which contain structural units derived from a methacrylate ester as the base unit, namely, (meth)acrylic resins in which structural units derived from methacrylate ester units account for at least 80 mol % of all the structural units, heating the resin to a temperature exceeding 170° C. and up to approximately 200° C. resulted in thermal decomposition, causing a deterioration in the resist pattern shape.

In contrast, in the present invention, because a resin with a Tg value of no more than 170° C. is used, the temperature range for which the resist obtained using the resist composition containing the component (A) undergoes softening without flowing overlaps with the temperature range for which favorable shrinking performance is exhibited by the water-soluble coating. It is thought that as a result, the resin is ideal for a shrink process used for forming a resist pattern with favorable rectangularity.

Because no thermal decomposition of the base resin occurs, thickness loss of the resist layer caused by base resin thermal decomposition does not occur, resulting in an even more superior resist pattern shape.

The component (A) preferably contains from 10 to 100 mol %, and even more preferably from 40 to 100 mol %, and most preferably 100 mol % of (meth)acrylate structural units. This enables a resist best suited to an ArF laser to be obtained.

Techniques for adjusting the Tg value of the component (A) to ensure that it falls within the range from 120 to 170° C. can be broadly classified into the methods (1) and (2) described below.

(1) Methods in which the ratio between acrylate structural units and methacrylate structural units within the component (A) is adjusted. (2) Methods in which appropriate side chains are selected for the (meth)acrylate structural units.

(1) Methods in which the Ratio between Acrylate Structural Units and Methacrylate Structural Units is Adjusted The Tg value of a resin can be increased by increasing the proportion of methacrylate structural units contained within the resin, whereas the Tg value of the resin can be lowered by increasing the proportion of acrylate structural units.

Accordingly, the component (A) can be prepared by ensuring that the respective proportions of acrylate structural units and methacrylate structural units incorporated within the resin generate a desirable Tg value.

There are no particular restrictions on the actual proportions used, provided the proportions of acrylate structural units and methacrylate structural units within the component (A) result in a combination that yields a Tg value within the range from 120 to 170° C.

The ratio (molar ratio) of acrylate structural units : methacrylate structural units required to ensure a Tg value within the range from 120 to 170° C. varies depending on the type of side chains present, but typically the ratio (molar ratio) of acrylate structural units: methacrylate structural units within the component (A) is within a range from (40 to 70):(60 to 30), and even more preferably from (40 to 60):(60 to 40). Resins containing 100% acrylate structural units are also suitable.

Specific examples of this type of component (A) include the types of resins described below.

(i) Copolymers containing both acrylate structural units and methacrylate structural units.

(ii) Mixed resins (A2), including either a mixed resin (A2-1), which contains an aforementioned copolymer (A1), and a polymer containing one of either acrylate structural units or methacrylate structural units but not the other, or a mixed resin (A2-2), which contains a polymer containing acrylate structural units but no methacrylate structural units, and a polymer containing methacrylate structural units but no acrylate structural units.

If the mixed resin (A2) is a mixed resin of a polymer containing only acrylate structural units and a polymer containing only methacrylate structural units, then the value of Tg is more readily adjusted. In such cases, the ratio (weight ratio) of the polymer containing only acrylate structural units: the polymer containing only methacrylate structural units, although also dependent on the nature of the side chains, is preferably within a range from (80 to 20):(20 to 80), and even more preferably from (40 to 60):(60 to 40).

The copolymer (A1) and the mixed resin (A2) may include a combination of two or more different structural units.

(2) Methods in which Appropriate Side Chains are Selected for the (Meth)acrylate Structural Units The value of Tg can also be adjusted by appropriate selection of the side chains of the (meth)acrylate structural units that constitute the component (A).

For example, in the case of a resin that includes a (meth) acrylate structural unit containing a lactone unit described below as a side chain, the value of Tg can be adjusted by altering the nature of the lactone unit. For example, comparing a resin that contains (meth)acrylate structural units derived from the γ-butyrolactone ester of (meth)acrylic acid (hereafter referred to as GBL structural units), and a resin that contains (meth)acrylate structural units derived from the norbornane lactone ester of (meth)acrylic acid (hereafter referred to as NL structural units), it is apparent that the Tg of the former resin is lower than that of the latter resin.

Accordingly, in those cases where it is desirable to lower the Tg value, GBL structural units can be introduced into the resin the constitutes the component (A), thereby lowering the Tg value of the component (A).

In contrast, to increase the Tg value, NL structural units can be introduced into the resin the constitutes the component (A), thereby increasing the Tg value of the component (A).

The component (A) may also include a resin that contains both GBL structural units and NL structural units. In such cases, the ratio (weight ratio) of GBL units within the component (A): NL structural units within the component (A), although dependent on factors such as the ratio of methacrylate structural units within the component (A): acrylate structural units within the component (A), and the nature of any other structural units, is preferably within a range from (80 to 20):(20 to 80), and even more preferably from (40 to 60):(60 to 40). By ensuring a ratio within this range, the Tg value for the component (A) can be more readily adjusted within the preferred range from 120 to 170° C.

Chain-like (meth)acrylate esters such as hydroxyethyl methacrylate lower the Tg value, and consequently the Tg value can also be adjusted by appropriate introduction of these units.

In order to ensure a favorable balance with other structural units, the proportion of GBL structural units and NL structural units within the component (A) is preferably maintained within the range specified for the structural units (a2) described below.

Examples of suitable resins include, for example, mixed resins (A-3) that include a polymer containing GBL structural units but no NL structural units, and a polymer containing NL structural units but no GBL structural units.

Naturally, the component (A) can also be prepared using a combination of the methods (1) and (2) described above.

As described above, a resist composition of the present invention is preferably a positive composition. In the case of a positive composition, the component (A) is an alkali-insoluble component containing so-called acid dissociable, dissolution inhibiting groups, and when acid is generated from the component (B) on exposure, this acid causes the acid dissociable, dissolution inhibiting groups to dissociate, rendering the component (A) alkali-soluble.

In the case of a positive composition, the component (A) is preferably a resin that includes a structural unit (a1) described below.

(a1): A (meth)acrylate structural unit containing an acid dissociable, dissolution inhibiting group.

In addition, the resin may also include the optional structural units (a2) to (a4) shown below.

(a2): A (meth)acrylate structural unit containing a lactone unit.

(a3): A (meth)acrylate structural unit containing a hydroxyl group.

(a4): A structural unit different from any of the above structural units (a1) to (a3).

[Structural Unit (a1)]

The acid dissociable, dissolution inhibiting group of the structural unit (a1) is a group which exhibits an alkali dissolution inhibiting effect that renders the entire component (A) alkali-insoluble prior to exposure, but then dissociates under the action of acid generated from the acid generator following exposure, causing the entire component (A) to become alkali-soluble.

As the acid dissociable, dissolution inhibiting group, any of the multitude of groups proposed for resins for use within ArF excimer laser resist compositions can be used. Typically, groups that form a cyclic or chain-like tertiary alkyl ester with the carboxyl group of the (meth)acrylic acid are the most widely known.

As the structural unit (a1), a structural unit containing an acid dissociable, dissolution inhibiting group that contains an aliphatic polycyclic group is preferred. This aliphatic polycyclic group can use any of the multitude of groups proposed for resins for use within ArF resists. Examples include groups in which one hydrogen atom has been removed from a bicycloalkane, tricycloalkane or tetracycloalkane or the like.

Specific examples include groups in which one hydrogen atom has been removed from a polycycloalkane such as adamantane, norbomane, isobornane, tricyclodecane or tetracyclododecane.

Of these polycyclic groups, adamantyl groups formed by removing one hydrogen atom from adamantane, norbomyl groups formed by removing one hydrogen atom from norbornane, and tetracyclododecanyl groups formed by removing one hydrogen atom from tetracyclododecane are preferred from an industrial viewpoint.

Specifically, the structural unit (a1) is preferably at least one unit selected from the groups represented by the general formulas (I), (II), and (III) shown below.

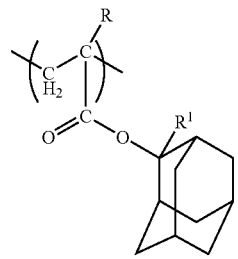

(I)

(wherein, R represents a hydrogen atom or a methyl group, and $R^1$ represents a lower alkyl group)

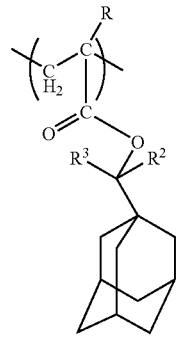

(II)

(wherein, R represents a hydrogen atom or a methyl group, and $R^2$ and $R^3$ each represent, independently, a lower alkyl group)

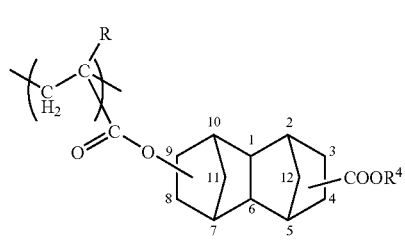

(III)

(wherein, R represents a hydrogen atom or a methyl group, and $R^4$ represents a tertiary alkyl group).

In the formula (I), the group $R^1$ is preferably a straight-chain or branched lower alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group. Of these, an alkyl group of at least 2 carbon atoms, and preferably from 2 to 5 carbon atoms is preferred, and in such cases, the acid dissociability tends to increase compared with the case in which $R^1$ is a methyl group. From an industrial viewpoint, a methyl group or ethyl group is preferred.

In the formula (II), the groups $R^2$ and $R^3$ each preferably represent, independently, a lower alkyl group of 1 to 5 carbon atoms. These types of groups tend to display a higher acid dissociability than a 2-methyl-2-adamantyl group.

Specifically, the groups $R^2$ and $R^3$ each represent, independently, the same types of straight-chain or branched lower alkyl groups described above for $R^1$. Of these, the case in which $R^2$ and $R^3$ are both methyl groups is preferred from an industrial viewpoint.

In the formula (III), the group $R^4$ represents a tertiary alkyl group such as a tert-butyl group or tert-amyl group, although the case in which $R^4$ is tert-butyl group is preferred industrially.

Furthermore, the group —$COOR^4$ may be bonded to either position 3 or 4 of the tetracyclododecanyl group shown in the formula, although a mixture of both isomers results, and so the bonding position cannot be further specified. Furthermore, the carboxyl group residue of the (meth)acrylate structural unit may be bonded to either position 8 or 9 of the tetracyclododecanyl group, although similarly, a mixture of both isomers results, and so the bonding position cannot be further specified.

The structural unit (al) typically accounts for 20 to 60 mol %, and preferably from 30 to 50 mol %, of the combined total of all the structural units that constitute the component (A). By ensuring the quantity is at least as large as the lower limit of this range, the polymer solubility can be more readily altered under the action of acid when the polymer is used in a positive resist composition, thereby ensuring excellent resolution. If the quantity exceeds the upper limit of the above range, then there is a danger that factors such as the level of balance with the other structural units may cause a deterioration in the adhesion between the resist pattern and the substrate.

[Structural Unit (a2)]

A lactone unit, that is, a group in which one hydrogen atom has been removed from a monocyclic or polycyclic lactone, is a polar group, and consequently when the component (A) is used within a positive resist composition, the structural unit (a2) is effective in improving the adhesion between the resist film and the substrate, and increasing the hydrophilicity relative to the developing solution.

There are no particular restrictions on the structural unit (a2), provided it includes this type of lactone unit, although the lactone unit is preferably one or more units selected from the general formulas (IV) and (V) shown below.

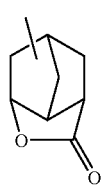

(IV)

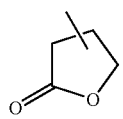

(V)

More specific examples of the structural unit (a2) include the (meth)acrylate structural units represented by the structural formulas shown below.

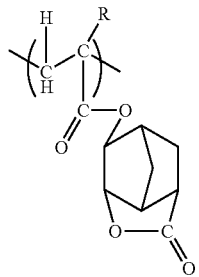

(i)

(wherein, R represents a hydrogen atom or a methyl group)

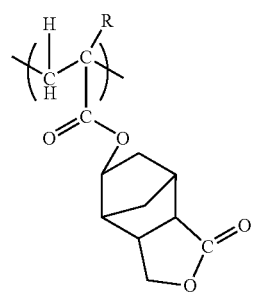

(ii)

(wherein, R represents a hydrogen atom or a methyl group)

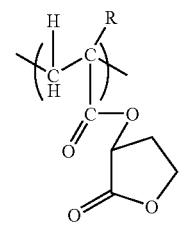

(iii)

(wherein, R represents a hydrogen atom or a methyl group)

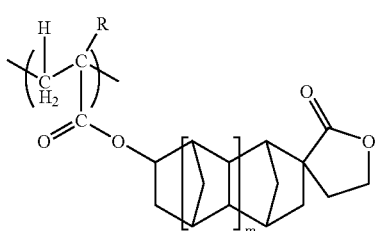

(iv)

(wherein, R represents a hydrogen atom or a methyl group, and m is either 0 or 1)

Of these units, γ-butyrolactone esters of (meth)acrylic acid with an ester linkage at the α carbon atom (the general formula (iii)), or norbomane lactone esters (the general formula (i)) are particularly preferred in terms of industrial availability.

The structural unit (a2) typically accounts for 20 to 60 mol %, and preferably from 30 to 50 mol %, of the combined total of all the structural units that constitute the component (A). If this quantity is lower than the lower limit of the above range, then the resolution deteriorates, whereas if the quantity exceeds the upper limit, there is a danger that the component will become difficult to dissolve in the resist solvent.

[Structural Unit (a3)]

Because the structural unit (a3) contains a hydroxyl group, use of the structural unit (a3) results in an increased hydrophilicity for the entire component (A) relative to the developing solution, and an improvement in the alkali solubility of the exposed sections of the resist. Accordingly, the structural unit (a3) contributes to an improvement in the resolution.

The structural unit (a3) can be appropriately selected from the multitude of units that have been proposed for the resins used in ArF excimer laser resist compositions, although aliphatic polycyclic groups that contain a hydroxyl group are preferred.

The aliphatic polycyclic group can be appropriately selected from the same multitude of aliphatic polycyclic groups described above in relation to the structural unit (a1).

Specifically, as the structural unit (a3), hydroxyl group-containing adamantyl groups (in which the number of hydroxyl groups is preferably from 1 to 3, and is most preferably 1), or carboxyl group-containing tetracyclododecanyl groups (in which the number of carboxyl groups is preferably from 1 to 3, and is most preferably 1) can be favorably used.

Hydroxyl group-containing adamantyl groups are particularly desirable. Specifically, using a structural unit represented by the general formula (VI) below as the structural unit (a3) increases the dry etching resistance and improves the verticalness of the pattern cross-sectional shape, meaning the resist pattern shape can be further improved, and is consequently preferred.

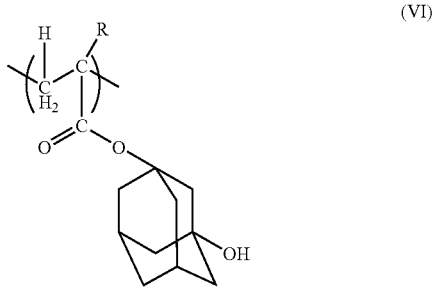

(VI)

(wherein, R represents a hydrogen atom or a methyl group)

Considering the level of balance with the other structural units, the structural unit (a3) typically accounts for 5 to 50 mol %, and preferably from 10 to 40 mol %, of the combined total of all the structural units that constitute the component (A).

[Structural Unit (a4)]

There are no particular restrictions on the structural unit (a4), provided it is a different structural unit that cannot be classified as any of the above structural units (a1) through (a3). In other words, any structural unit that contains no acid dissociable, dissolution inhibiting groups, lactones, or hydroxyl groups is suitable. For example, (meth)acrylate structural units containing an aliphatic polycyclic group are preferred. If this type of structural unit is used, then when the resin is used within a positive resist composition, the composition exhibits superior resolution for isolated patterns through to semi-dense patterns (line and space patterns in which for a line width of 1, the space width is from 1.2 to 2), which is preferred.

Suitable examples of the aliphatic polycyclic group include similar groups to those listed in the above description for the structural unit (a1), and any of the multitude of materials conventionally used for ArF positive resist materials or KrF positive resist materials can be used.

From the viewpoint of industrial availability, one or more groups selected from amongst tricyclodecanyl groups, adamantyl groups, and tetracyclododecanyl groups is preferred.

Specific examples of the structural unit (a4) are shown below by the structural formulas (VII) to (IX).

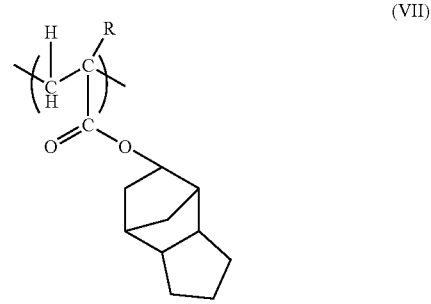

(VII)

(wherein, R represents a hydrogen atom or a methyl group)

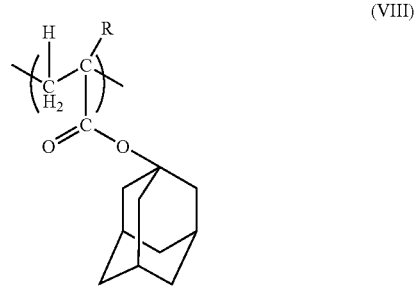

(VIII)

(wherein, R represents a hydrogen atom or a methyl group)

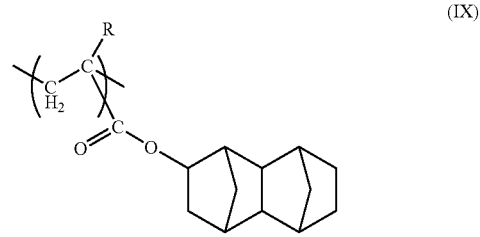

(IX)

(wherein, R represents a hydrogen atom or a methyl group)

If the structural unit (a4) accounts for 1 to 30 mol %, and preferably from 5 to 20 mol %, of the combined total of all the structural units that constitute the component (A), then the composition exhibits superior resolution for isolated patterns through to semi-dense patterns, which is desirable.

Of the structural units of the component (A), the structural units (a2) to (a4) can be selected and combined with the structural unit (a1) in accordance with factors such as the intended application, although components that include all of the structural units (a1) to (a3) are preferred in terms of factors such as etching resistance, resolution, and adhesion between the resist film and the substrate.

For example, in the case of a tertiary system that contains the structural units (a1) through (a3), setting the quantity of the structural unit (a1) to 20 to 60 mol %, and preferably from 30 to 50 mol %, of the total of all the structural units, the quantity of the structural unit (a2) to 20 to 60 mol %, and preferably from 30 to 50 mol %, of the total of all the structural units, and the quantity of the structural unit (a3) to 5 to 50 mol %, and preferably from 10 to 40 mol %, of the total of all the structural units is preferred in terms of etching resistance, resolution, adhesion, and resist pattern shape.

Depending on factors such as the intended application, structural units other than the aforementioned structural units (a1) through (a4) can also be used.

Specifically, the component (A) includes acrylate structural units and/or methacrylate structural units, and from the viewpoints of resolution and resist pattern shape and the like, copolymers (i) and (ii) described below, or mixed resins thereof are preferred.

The superscript a refers to an acrylate structural unit, and the superscript m refers to a methacrylate structural unit.

Copolymer (i): a copolymer that includes an acrylate structural unit (a1$^a$) containing an acid dissociable, dissolution inhibiting group, an acrylate structural unit (a2$^a$) containing a lactone unit, and an acrylate structural unit (a3$^a$) containing a hydroxyl group.

Setting the ratio (molar ratio) between the structural units (a1$^a$), the structural units (a2$^a$) and the structural units (a3$^a$) to (20 to 60):(20 to 60):(10 to 40), and preferably to (30 to 50):(30 to 50):(20 to 40), generates a Tg value for the copolymer (i) within a preferred range from 100 to 140° C.

Copolymer (ii): a copolymer that includes a methacrylate structural unit (a1$^m$) containing an acid dissociable, dissolution inhibiting group, a methacrylate structural unit (a2$^m$) containing a lactone unit, and an acrylate structural (a3$^a$) unit containing a hydroxyl group.

Setting the ratio (molar ratio) between the structural units (a1$^m$), the structural units (a2$^m$) and the structural units (a3a) to (20 to 60):(20 to 60):(10 to 40), and preferably to (30 to 50):(30 to 50):(10 to 30), generates a Tg value for the copolymer (ii) within a preferred range from 120 to 180° C.

In the case of a mixed resin of the copolymers (i) and (ii), there are no particular restrictions on the mixing ratio (weight ratio) between the copolymer (i) and the copolymer (ii), although using a mixing ratio of (80 to 20):(20 to 80), and preferably (40 to 60):(60 to 40), yields a Tg value that falls within the ideal range for a shrink process.

In such a mixed resin, mixtures in which the lactone unit in one of the copolymers (i) or (ii) is a group derived from γ-butyrolactone, and the lactone unit in the other copolymer is a group derived from norbornane lactone offer superior etching resistance, and are consequently preferred.

Although there are no particular restrictions on the weight average molecular weight (Mw) (the polystyrene equivalent value determined by gel permeation chromatography) of the component (A), the value is preferably within a range from 5,000 to 30,000, and even more preferably from 7,000 to 15,000. If the weight average molecular weight is larger than this range, then the solubility of the component within the resist solvent deteriorates, whereas if the value is smaller than the above range, there is a danger of a deterioration in the cross-sectional shape of the resist pattern.

Furthermore, there are no particular restrictions on the ratio Mw/Mn (number average molecular weight), although the ratio is preferably within a range from 1.0 to 6.0, and even more preferably from 1.5 to 2.5. If this ratio is larger than this range, then there is a danger of a deterioration in both the resolution and the pattern shape.

The component (A) can be produced easily by a conventional radical polymerization or the like of the monomers corresponding with the aforementioned structural units (a1) through (a4), using a radical polymerization initiator such as azobisisobutyronitrile (AIBN).

Component (B)

As the component (B), a compound appropriately selected from known materials used as acid generators in conventional chemically amplified resists can be used.

Specific examples of suitable compounds include onium salts such as diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate, and triphenylsulfonium nonafluorobutanesulfonate. Of these compounds, sulfonium salts containing a fluorinated alkylsulfonate ion as the anion are preferred.

The component (B) can be used either alone, or in combinations of two or more different compounds.

The blend quantity of the component (B) is typically within a range from 0.5 to 30 parts by weight, and preferably from 1 to 10 parts by weight, per 100 parts by weight of the component (A). At quantities less than 0.5 parts by weight, pattern formation may not proceed satisfactorily, whereas if the quantity exceeds 30 parts by weight, achieving a uniform solution can be difficult, which increases the danger of a deterioration in the storage stability.

A resist composition of the present invention can be produced by dissolving the aforementioned component (A) and the aforementioned component (B), together with any of the optional components described below, preferably in an organic solvent.

The organic solvent may be any solvent capable of dissolving the component (A) and the component (B) to generate a uniform solution, and one or more solvents selected from known materials used as the solvents for conventional chemically amplified resists can be used.

Specific examples of the solvent include ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents can be used alone, or as a mixed solvent of two or more different solvents.

In particular, mixed solvents of propylene glycol monomethyl ether acetate (PGMEA) and a polar solvent containing a hydroxyl group or a lactone such as propylene glycol monomethyl ether (PGME), ethyl lactate (EL) or γ-butyrolactone improve the storage stability of the resist composition, and are consequently preferred. There are no particular restrictions on the quantity used of the solvent, which should be sufficient to generate a concentration that enables favorable application of the composition to a substrate or the like. For example, the solid fraction that constitutes the positive resist composition of the present invention (the fraction that remains as a solid when the solvent (C) is removed) is typically within a range from 2 to 20% by weight, and preferably from 3 to 15% by weight.

In a resist composition of the present invention, in order to improve properties such as the resist pattern shape and the post exposure stability of the latent image formed by the pattern-wise exposure of the resist layer, a nitrogen-containing organic compound can also be added as an optional component. A multitude of these nitrogen-containing organic compounds have already been proposed, and any of these known compounds can be used, although a secondary lower aliphatic amine or tertiary lower aliphatic amine is preferred.

Here, a lower aliphatic amine refers to an alkyl or alkyl alcohol amine of no more than 5 carbon atoms, and examples of these secondary and tertiary amines include trimethylamine, diethylamine, triethylamine, di-n-propylamine, tri-n-propylamine, tripentylamine, diethanolamine, triethanolamine and triisopropanolamine, and alkanolamines such as triethanolamine are particularly preferred.

These amines may be used alone, or in combinations of two or more different compounds.

This amine is typically added in a quantity within a range from 0.01 to 2% by weight relative to the weight of the component (A).

In order to prevent any deterioration in sensitivity caused by the addition of the aforementioned nitrogen-containing organic compound, and improve the resist pattern shape, the post exposure stability of the latent image formed by the pattern-wise exposure of the resist layer, and the sensitivity adjustment and the like, an organic carboxylic acid, or a phosphorus oxo acid or derivative thereof can also be added as another optional component. The nitrogen-containing organic compound and this acid component can be used in combination, or either one may also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

This acid component is typically used in a quantity within a range from 0.01 to 5.0 parts by weight per 100 parts by weight of the component (A).

Miscible additives can also be added to a resist composition of the present invention according to need, including additive resins for improving the properties of the resist film, surfactants for improving the ease of application, dissolution inhibitors, plasticizers, stabilizers, colorants and halation prevention agents.

<<Water-Soluble Coating Formation Agent>>

The water-soluble coating formation agent used in the present invention contains a water-soluble polymer.

A water-soluble coating formation agent containing this type of water-soluble polymer is ideal for use within a shrink process.

From an industrial viewpoint, this water-soluble polymer is preferably an acrylic-based polymer, a vinyl-based polymer, a cellulose derivative, an alkylene glycol-based polymer, a urea-based polymer, a melamine-based polymer, an epoxy-based polymer or an amide-based polymer, and the use of a polymer containing the above types of monomers as structural units is preferred.

Acrylic-based polymers refer to polymers that contain an acrylic-based monomer, vinyl-based polymers refer to polymers that contain a vinyl-based monomer, cellulose-based polymers refer to polymers that contain a cellulose-based monomer, alkylene glycol-based polymers refer to polymers that contain an alkylene glycol-based monomer, urea-based polymers refer to polymers that contain a urea-based monomer, melamine-based polymers refer to polymers that contain a melamine-based monomer, epoxy-based polymers refer to polymers that contain an epoxy-based monomer, and amide-based polymers refer to polymers that contain an amide-based monomer.

These polymers can be used either alone, or in mixtures of two or more different polymers.

Specific examples of suitable acrylic-based polymers include polymers or copolymers containing structural units derived from monomers such as acrylic acid, acrylamide, methyl acrylate, methacrylic acid, methyl methacrylate, N,N-dimethylacrylamide, N,N-dimethylaminopropylmethacrylamide, N,N-dimethylaminopropylacrylamide, N-methylacrylamide, diacetone acrylamide, N,N-dimethylaminoethyl methacrylate, N,N-diethylaminoethyl methacrylate, N,N-dimethylaminoethyl acrylate, and acryloyl morpholine.

Specific examples of suitable vinyl-based polymers include polymers or copolymers containing structural units derived from monomers such as morpholine, N-vinylpyrrolidone, vinylimidazolidinone, and vinyl acetate.

Specific examples of suitable cellulose derivatives include hydroxypropyl methylcellulose phthalate, hydroxypropyl methylcellulose acetate phthalate, hydroxypropyl methylcellulose hexahydrophthalate, hydroxypropyl methylcellulose acetate succinate, hydroxypropyl methylcellulose, hydroxypropyl cellulose, hydroxyethyl cellulose, cellulose acetate hexahydrophthalate, carboxymethylcellulose, ethylcellulose, and methylcellulose.

Specific examples of suitable alkylene glycol-based polymers include addition polymers or addition copolymers of monomers such as ethylene glycol or propylene glycol.

Specific examples of suitable urea-based polymers include polymers containing structural units derived from monomers such as methylolated urea, dimethylolated urea, and ethylene urea.

Specific examples of suitable melamine-based polymers include polymers containing structural units derived from monomers such as methoxymethylated melamine, methoxymethylated isobutoxymethylated melamine, and methoxyethylated melamine.

In addition, water-soluble epoxy-based polymers and nylon-based polymers can also be used.

Of the above polymers, a coating agent containing at least one polymer selected from a group consisting of alkylene glycol-based polymers, cellulose-based polymers, vinyl-based polymers and acrylic-based polymers is preferred, and acrylic resins are the most preferred as they also offer simple pH adjustment. In addition, using a copolymer of an acrylic-based monomer and another non-acrylic monomer is preferred, as such copolymers enable efficient narrowing of the photoresist pattern size, while maintaining the shape of the photoresist pattern during the heat treatment.

Water-soluble polymers that include N-vinylpyrrolidone as a proton donor monomer and acrylic acid as a proton acceptor monomer are particularly preferred as they exhibit a particularly large shrinkage ratio on heating. In other words, the water-soluble polymer preferably contains structural units derived from acrylic acid and structural units derived from vinylpyrrolidone.

In those cases where a copolymer is used as the water-soluble polymer, there are no particular restrictions on the relative proportions of the structural components, although if long term stability is considered particularly important, then the proportion of the acrylic-based polymer is preferably greater than that of the other structural polymers. In order to improve the long term stability, in addition to increasing the proportion of the acrylic-based polymer as described above, an acidic compound such as p-toluenesulfonic acid or dodecylbenzenesulfonic acid can also be added.

The water-soluble coating formation agent preferably also contains a surfactant. There are no particular restrictions on the surfactant, although the surfactant should have properties such that when added to the water-soluble polymer described above, the solubility is good, a suspension does not develop, and co-solubility with the polymer component is favorable. By using a surfactant that satisfies these types of properties, the problem of defects, which is thought to be related to the occurrence of microfoam during the application of the water-soluble coating formation agent to the resist pattern, can be effectively prevented.

Specifically, one or more surfactants selected from a group consisting of N-alkylpyrrolidone-based surfactants, quaternary ammonium salt-based surfactants, and polyoxyethylene phosphate ester-based surfactants are preferred.

As the N-alkylpyrrolidone-based surfactant, compounds represented by a general formula (X) shown below are preferred.

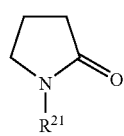

(X)

(wherein, $R^{21}$ represents an alkyl group of 6 or more carbon atoms) Specific examples of such N-alkylpyrrolidone-based surfactants include N-hexyl-2-pyrrolidone, N-heptyl-2-pyrrolidone, N-octyl-2-pyrrolidone, N-nonyl-2-pyrrolidone, N-decyl-2-pyrrolidone, N-undecyl-2-pyrrolidone, N-dodecyl-2-pyrrolidone, N-tridecyl-2-pyrrolidone, N-tetradecyl-2-pyrrolidone, N-pentadecyl-2-pyrrolidone, N-hexadecyl-2-pyrrolidone, N-heptadecyl-2-pyrrolidone, and N-octadecyl-2-pyrrolidone. Of these, N-octyl-2-pyrrolidone ("Surfadone LP100", manufactured by ISP Co., Ltd.) is preferred.

As the quaternary ammonium salt-based surfactant, compounds represented by a general formula (XI) shown below are preferred.

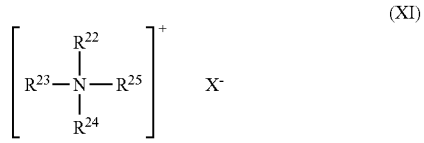

(XI)

(wherein, $R^{22}$, $R^{23}$, $R^{24}$ and $R^{25}$ each represent, independently, an alkyl group or a hydroxyalkyl group (although at least one of the groups represents an alkyl group or a hydroxyalkyl group of 6 or more carbon atoms); and $X^-$ represents a hydroxide ion or a halogen ion) Specific examples of such quaternary ammonium salt-based surfactants include dodecyltrimethylammonium hydroxide, tridecyltrimethylammonium hydroxide, tetradecyltrimethylammonium hydroxide, pentadecyltrimethylammonium hydroxide, hexadecyltrimethylammonium hydroxide, heptadecyltrimethylammonium hydroxide, and octadecyltrimethylammonium hydroxide. Of these, hexadecyltrimethylammonium hydroxide is preferred.

As the polyoxyethylene phosphate ester-based surfactant, compounds represented by a general formula (XII) shown below are preferred.

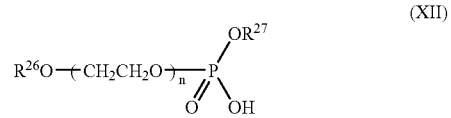

(XII)

(wherein, $R^{26}$ represents an alkyl group or alkylallyl group of 1 to 10 carbon atoms; $R^{27}$ represents a hydrogen atom or a $(CH_2CH_2O)R^{26}$ group (wherein $R^{26}$ is as defined above); and n represents an integer from 1 to 20)

Specific examples of such polyoxyethylene phosphate ester-based surfactants include "Plysurf A212E" and "Plysurf A210G", which are commercial products manufactured by Dai-ichi Kogyo Seiyaku Co., Ltd.

The blend quantity of the surfactant is preferably within a range from 0.1 to 10% by weight, and even more preferably from 0.2 to 2% by weight, relative to the total solid fraction of the water-soluble coating formation agent. Blend quantities outside the above range can cause a deterioration in the ease of application, resulting in variations in the degree of pattern shrinkage as a result of a decrease in the in-plane uniformity, and an increased likelihood of defects, which are thought to be closely related to the occurrence of fine bubbles known as microfoam that can be generated during application.

From the viewpoints of preventing impurities and enabling favorable pH adjustment, the water-soluble coating formation agent may also contain an optional water-soluble amine.

Examples of this water-soluble amine include those amines with a pKa value (acid dissociation constant) in an aqueous solution at 25° C. of 7.5 to 13. Specific examples of suitable amines include alkanolamines such as monoethanolamine, diethanolamine, triethanolamine, 2-(2-aminoethoxy) ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine, and triisopropanolamine; polyalkylene polyamines such as diethylenetriamine, triethylenetetramine, propylenediamine, N,N-diethylethylenediamine, 1,4-butanediamine, N-ethylethylenediamine, 1,2-propanediamine, 1,3-propanediamine, and 1,6-hexanediamine; aliphatic amines such as 2-ethylhexylamine, dioctylamine, tributylamine, tripropylamine, triallylamine, heptylamine, and cyclohexylamine; aromatic amines such as benzylamine and diphenylamine; and cyclic amines such as piperazine, N-methyl-piperazine, methylpiperazine, and hydroxyethylpiperazine. Of these, amines with boiling points of 140° C. (760 mmHg) or higher are preferred, and monoethanolamine and triethanolamine and the like are particularly preferred.

In those cases in which a water-soluble amine is added, the quantity of the amine is preferably within a range from 0.1 to 30% by weight, and even more preferably from 2 to 15% by weight, relative to the total solid fraction of the water-soluble coating formation agent. If the quantity is less than 0.1% by weight then there is a danger of a deterioration in the solution over time, whereas in contrast, if the quantity exceeds 30% by weight, there is a danger of a deterioration in the shape of the photoresist pattern.

From the viewpoints of reducing the photoresist pattern size and suppressing the occurrence of defects, an additional non-amine-based water-soluble organic solvent may also be added to the water-soluble coating formation agent if desired.

This non-amine-based water-soluble organic solvent may be any non-amine-based organic solvent that exhibits miscibility with water, and suitable examples include sulfoxides such as dimethylsulfoxide; sulfones such as dimethyl sulfone, diethyl sulfone, bis(2-hydroxyethyl) sulfone, and tetramethylene sulfone; amides such as N,N-dimethylformamide, N-methylformamide, N,N-dimethylacetamide, N-methylacetamide, and N,N-diethylacetamide; lactams such as N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone; imidazolidinones such as 1,3-dimethyl-2-imidazolidinone, 1,3-diethyl-2-imidazolidinone, and 1,3-diisopropyl-2-imidazolidinone; and polyhydric alcohols or derivatives thereof such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, diethylene glycol monobutyl ether, propylene glycol, propylene glycol monomethyl ether, glycerol, 1,2-butylene glycol, 1,3-butylene glycol, and 2,3-butylene glycol. Of these, from the viewpoints of reducing the photoresist pattern size and suppressing the occurrence of defects, polyhydric alcohols or their derivatives are preferred, and glycerol is particularly preferred. This non-amine-based water-soluble organic solvent can use either a single compound, or a mixture of two or more compounds.

In those cases in which a non-amine-based water-soluble organic solvent is added, the quantity of the solvent is preferably within a range from 0.1 to 30% by weight, and even more preferably from 0.5 to 15% by weight, relative to the water-soluble polymer. If this blend quantity is less than 0.1% by weight then the defect suppression effect tends to weaken, whereas in contrast, if the quantity exceeds 30% by weight, a mixing layer tends to form between the coating and the photoresist pattern, which is undesirable.

The water-soluble coating formation agent is preferably used in the form of an aqueous solution with a concentration of 3 to 50% by weight, and even more preferably from 5 to 20% by weight. If the concentration is less than 3% by weight, a satisfactory coating may not be formed on the substrate, whereas at concentrations exceeding 50% by weight, not only does increasing the concentration not produce an equivalent improvement in the desired effects, but the handling of the agent also becomes more difficult.

As described above, the water-soluble coating formation agent is usually used in the form of an aqueous solution using water as the solvent, although a mixed solvent of water and an alcohol-based solvent could also be used. Examples of this alcohol-based solvent include monovalent alcohols such as methyl alcohol, ethyl alcohol, propyl alcohol, and isopropyl alcohol. The alcohol-based solvent is mixed with the water in quantities of no more than 30% by weight.

By using a water-soluble coating formation agent with the configuration described above within a method for forming a resist pattern that includes a shrink process, the shape of the resulting resist pattern exhibits favorable rectangularity. In cases where a plurality of resist patterns is formed on a single substrate, irregularities within the pattern shapes caused by variations in the degree of shrinkage are minimal, meaning a resist pattern of uniform pattern size is able to be formed.

EXAMPLES

As follows is a more detailed description of the present invention based on a series of examples, although the present invention is in no way restricted to the examples presented below. Unless otherwise stated, blend quantities refer to weight % values.

Example 1

0.25 mols of a 30/50/20 (molar ratio) mixture of 2-ethyl-2-adamantyl acrylate, norbornane lactone acrylate of the general formula (i) (wherein R is a hydrogen atom), and 3-hydroxy-1-adamantyl acrylate of the general formula (VI) (wherein R is a hydrogen atom) was dissolved in 500 ml of methyl ethyl ketone (MEK), and 0.01 mols of AIBN was then added to the solution and dissolved. The thus obtained solution was heated to a temperature of 65 to 70° C., and maintained at this temperature for 3 hours. Subsequently, the reaction solution was poured into 3 L of vigorously stirred isopropanol, and the precipitated solid was isolated by filtration. The thus obtained solid product was dissolved in 300 ml of MEK, poured into 3 L of vigorously stirred methanol, and once again the precipitated solid was isolated by filtration and then dried, yielding a resin X for which the weight average molecular weight (Mw)=10,000, Mw/Mn=2.0, and Tg =approximately 130° C. 0.25 mols of a 40/40/20 (molar ratio) mixture of 2-methyl-2-adamantyl methacrylate, y-butyrolactone methacrylate of the general formula (iii) (wherein R is a methyl group), and 3-hydroxy-1-adamantyl acrylate of the general formula (VI) (wherein R is a hydrogen atom) was reacted in the same manner as above, yielding a resin Y for which the weight average molecular weight (Mw)=10,000, Mw/Mn=1.8, and Tg=approximately 170° C.

The resin X and the resin Y were mixed together in a 50:50 ratio (weight ratio), yielding a mixed resin (the component (A)) for which Tg=approximately 150° C.

To 100 parts by weight of the thus obtained mixed resin were added 3.0 parts by weight of triphenylsulfonium nonafluorobutanesulfonate (the component (B)), 0.15 parts by weight of triethanolamine, and 900 parts by weight of a mixed solvent of PGMEA:EL (1:1), and following dissolution, the solution was filtered through a filter of pore size 0.05 μm, thereby completing preparation of a positive resist composition.

The thus obtained resist composition was applied to a silicon wafer using a spinner, and was then prebaked and dried on a hotplate at 115° C. for 90 seconds, thereby forming a resist layer with a film thickness of 350 nm.

This layer was then selectively irradiated with an ArF excimer laser (193 nm) through a mask pattern, using an ArF exposure apparatus NSR-S302 (manufactured by Nikon Corporation; NA (numerical aperture)=0.60; σ=0.75).

The resist was then subjected to PEB treatment at 100° C for 90 seconds, subsequently subjected to puddle development for 60 seconds at 23° C. in a 2.38% by weight aqueous solution of tetramethylammonium hydroxide, and was then washed for 20 seconds with water, and dried.

As a result of this photoresist pattern formation, a hole pattern with a hole diameter of 140 nm was formed.

Next, a water-soluble coating with a total solid fraction concentration of 8.0% by weight, which was formed by dissolving 10 g of a copolymer of acrylic acid and vinylpyrrolidone (acrylic acid : vinylpyrrolidone=2:1 (weight ratio)), 0.9 g of triethanolamine, and 0.02 g of Surfadone LP 100 (manufactured by ISP Co., Ltd.) as an N-alkylpyrrolidone-based surfactant in pure water, was applied to the surface of the hole pattern to form a laminate. The film thickness (the height from the surface of the substrate) of the water-soluble coating of the laminate was 200 nm. The laminate was then subjected to heat treatment (a shrink process) at 145° C. for 60 seconds. Subsequently, the water-soluble coating was removed by washing with pure water at 23° C.

As a result, the size of the hole pattern was reduced by approximately 20 nm, while the highly vertical cross-sectional shape that was present immediately following developing was able to be retained, thus yielding a hole pattern of favorable rectangularity with a hole diameter of 120 nm.

All of the plurality of hole patterns formed on the one substrate remained uniform, with no variation in shape or hole diameter.

Example 2

With the exception of replacing the component (A) of the example 1 with a single copolymer (a resin Z, for which weight average molecular weight (Mw)=10,000, Mw/Mn=1.9, and Tg=approximately 160° C.), which was produced from a 40/40/20 (molar ratio) mixture of 2-ethyl-2-adamantyl methacrylate, norbomane lactone acrylate of the general formula (i) (wherein R is a hydrogen atom), and 3-hydroxy-1-adamantyl acrylate of the general formula (VI) (wherein R is a hydrogen atom) using the same method as the example 1, a positive resist composition was prepared in the same manner as the example 1.

Subsequently, with the exception of altering the PEB temperature to 90° C., a resist pattern was formed in the same manner as the example 1, thereby yielding a hole pattern with a hole diameter of 140 nm.

Finally, when a shrink process using a water-soluble coating was conducted in the same manner as the example 1, the size of the hole pattern was reduced by approximately 20 nm, while the highly vertical cross-sectional shape was retained, thus yielding a hole pattern of favorable rectangularity with a hole diameter of 120 nm. All of the plurality of hole patterns formed on the one substrate remained uniform, with no variation in shape or hole diameter.

Comparative Example 1

With the exception of replacing the mixed resin of the example 1 with 0.25 mols of a 40/40/20 (molar ratio) mixture of 2-methyl-2-adamantyl methacrylate, γ-butyrolactone methacrylate of the general formula (iii) (wherein R is a methyl group), and 3-hydroxy-1-adamantyl methacrylate of the general formula (VI) (wherein R is a methyl group), a resin was obtained in the same manner as the example 1, and this resin had a weight average molecular weight=10,000, and Mw/Mn=2.0, but the Tg value of the resin could not be measured as the 2-methyl-2-adamantyl methacrylate decomposed at 175° C. With the exception of using this resin, the steps from exposure through to developing were conducted in the same manner as the example 1, thus forming a hole pattern with a hole diameter of 140 nm.

A shrink process was then conducted in the same manner as the example 1.

As a result, the pattern spacing of the resist pattern underwent no narrowing at a heating temperature of 145° C.

It is thought that this observation reflects the fact that because the heating temperature was considerably lower than the Tg value, the resist remained hard, meaning that the shrinking power of the water-soluble coating was unable to narrow the pattern spacing of the resist pattern.

Comparative Example 2

With the exception of raising the heating temperature from 145° C. to 165° C., operations were conducted in the same manner as the comparative example 1. As a result, the water-soluble coating still underwent no shrinkage. In addition, during the operation for removing the water-soluble coating using pure water, a portion of the water-soluble coating remained stuck to the substrate.

It is thought that this observation indicates that because the heating temperature was high, self cross-linking occurred within the water-soluble coating.

From the above results it is clear that by using a resist composition that includes, as a base resin, a resin that contains structural units derived from a (meth)acrylate ester, and has a glass transition temperature that falls within a range from 120 to 170° C., a shrink process can be used to form a resist pattern with favorable rectangularity. By using this resist composition, the produced resist pattern suffers no water-soluble coating residues, and exhibits a favorable shape. Furthermore, by using this resist composition, the pitch dependency in those cases where a plurality of resist patterns is formed on a single substrate is minimal, meaning the plurality of patterns on the single substrate can be formed uniformly, with no variation in the degree of narrowing.

INDUSTRIAL APPLICABILITY

As described above, in the present invention, a shrink process in which a treatment such as heating is conducted following formation of a resist pattern to effect a narrowing of the resist pattern can be used for forming a favorable resist pattern, meaning the present invention is extremely useful industrially.

The invention claimed is:

1. A resist composition, comprising a resin component (A) that displays changed alkali solubility under action of acid, and an acid generator component (B) that generates acid on exposure, which is used in a shrink process comprising the steps of: providing a resist layer formed from said resist composition on top of a support, forming a resist pattern in said resist layer, providing a water-soluble coating formed from a water-soluble coating formation agent comprising a water-soluble polymer on top of said resist pattern, and shrinking said water-soluble coating by heating, thereby narrowing a spacing of said resist pattern, wherein said component (A) is a resin comprising structural units derived from a (meth)acrylate ester, exhibits a glass transition temperature that falls within a range from 120 to 170° C.

and is either one of:

a mixed resin comprising a polymer that comprises both structural units derived from an acrylate ester and structural units derived from a methacrylate ester, and a polymer that comprises one of either structural units derived from an acrylate ester or structural units derived from a methacrylate ester, but not another, and a mixed resin comprising a polymer that comprises structural units derived from an acrylate ester but no structural units derived from a methacrylate ester, and a polymer that comprises structural units derived from a methacrylate ester but no structural units derived from an acrylate ester.

2. A resist composition according to claim 1, wherein said component (A) comprises both structural units derived from an acrylate ester and structural units derived from a methacrylate ester.

3. A resist composition according to claim 1, wherein said component (A) comprises a copolymer comprising both structural units derived from an acrylate ester and structural units derived from a methacrylate ester.

4. A resist composition according to claim 1, wherein said component (A) comprises a mixed resin of:

a copolymer (i) comprising structural units ($a1^a$) derived from an acrylate ester containing an acid dissociable, dissolution inhibiting group, structural units ($a2^a$) derived from an acrylate ester containing a lactone unit, and structural units ($a3^a$) derived from an acrylate ester containing a hydroxyl group, and a copolymer (ii) comprising structural units ($a1^m$) derived from a methacrylate ester containing an acid dissociable, dissolution inhibiting group, structural units ($a2^m$) derived from a methacrylate ester containing a lactone unit, and structural units ($a3^a$) derived from an acrylate ester containing a hydroxyl group.

5. A resist composition according to claim 1, wherein said component (A) is a mixed resin comprising:

a polymer comprising (meth)acrylate structural units derived from a γ-butyrolactone ester of (meth)acrylic acid, but comprising no (meth)acrylate structural units derived from a norbornane lactone ester of (meth)acrylic acid, and a polymer comprising (meth)acrylate structural units derived from a norbornane lactone ester of (meth)acrylic acid, but comprising no (meth)acrylate structural units derived from a γ-butyrolactone ester of (meth)acrylic acid.

6. A resist composition according to claim 1, wherein said component (B) is an onium salt with a fluorinated alkylsulfonate ion as an anion.

7. A resist composition according to claim 1, further comprising a nitrogen-containing compound.

8. A laminate, wherein a resist pattern formed from a resist composition according to claim 1, and a water-soluble coating formed from a water-soluble coating formation agent comprising a water-soluble polymer are laminated on top of a support.

9. A method for forming a resist pattern, comprising the steps of:

providing a resist layer formed from a resist composition on top of a support, forming a resist pattern in said resist layer, and subsequently conducting a shrink process by providing a water-soluble coating formed from a water-soluble coating formation agent comprising a water-soluble polymer on top of said resist pattern, and shrinking said water-soluble coating by heating, thereby narrowing a spacing of said resist pattern, wherein a resist composition according to claim 1 is used as said resist composition.

10. A method for forming a resist pattern according to claim 9, wherein said water-soluble polymer is selected from a group consisting of acrylic-based polymers, vinyl-based polymers, cellulose derivatives, alkylene glycol-based polymers, urea-based polymers, melamine-based polymers, epoxy-based polymers, and amide-based polymers.

11. A method for forming a resist pattern according to claim 10, wherein said water-soluble polymer comprises structural units derived from acrylic acid and structural units derived from vinylpyrrolidone.

12. A method for forming a resist pattern according to claim 9, wherein said water-soluble coating formation agent further comprises a water-soluble amine and/or a surfactant.

* * * * *

UNITED STATES PATENT AND TRADEMARK OFFICE
CERTIFICATE OF CORRECTION

PATENT NO. : 7,544,460 B2
APPLICATION NO. : 10/563705
DATED : June 9, 2009
INVENTOR(S) : Hada et al.

It is certified that error appears in the above-identified patent and that said Letters Patent is hereby corrected as shown below:

Column 5, Line 37, change "1 60°" to --160°--.

Column 8, Line 2, change "(Al)," to --(A1),--.

Column 9, Line 16, change "(al)" to --(a1)--.

Column 9, Line 29, change "(al)" to --(a1)--.

Column 9, Line 33(Approx.), change "(al)" to --(a1)--.

Column 9, Line 46, change "(al )," to --(a1),--.

Column 9, Line 56, change "norbomane," to --norbornane,--.

Column 9, Line 59, change "norbomyl" to --norbornyl--.

Column 9, Line 65, change "(al)" to --(a1)--.

Column 10, Line 53, change "1to" to --1 to--.

Column 11, Line 19, change "(al)" to --(a1)--.

Column 11, Line 45, after "below." delete "(IV)".

Column 12, Line 50-57 (Approx.), change " 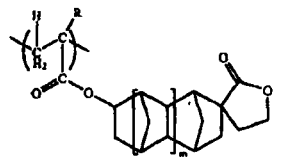 " to

Signed and Sealed this
Thirtieth Day of October, 2012

David J. Kappos
Director of the United States Patent and Trademark Office

CERTIFICATE OF CORRECTION (continued)
U.S. Pat. No. 7,544,460 B2

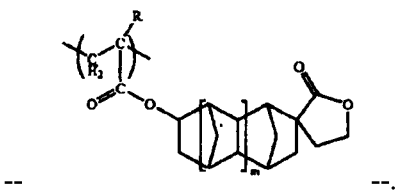
-- --.

Column 12, Line 62, change "1 )" to --1)--.

Column 12, Line 65, change "norbomane" to --norbornane--.

Column 13, Lines 39-49 (Approx.), change " 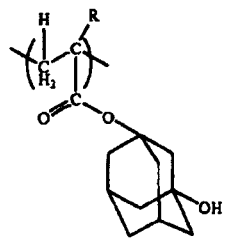 " to

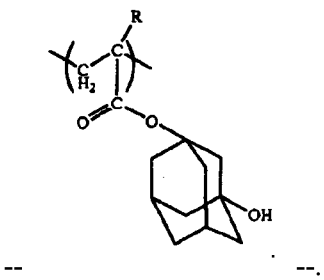
-- --.

Column 13, Line 61, change "(al)" to --(a1)--.

Column 14, Line 7, change "(al)," to --(a1),--.

Column 14, Lines 33-45 (Approx.), change " 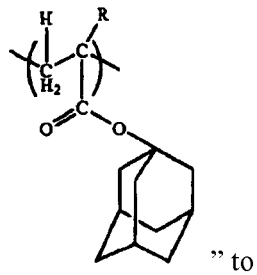 " to

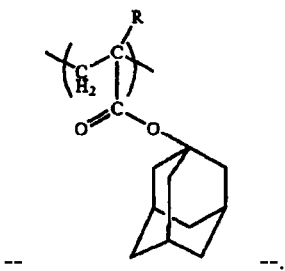
-- --.

CERTIFICATE OF CORRECTION (continued)
U.S. Pat. No. 7,544,460 B2

Column 15, Line 3, change "(al)" to --(a1)--.

Column 15, Line 7, change "(al)" to --(a1)--.

Column 15, Line 18, change "(al)" to --(a1)--.

Column 15, Line 43, change "(a3a)" to --(a3$^a$)--.

Column 15, Line 56, change "norbomane" to --norbornane--.

Column 20, Line 14-21 (Approx.), after "ion)" delete "Specific examples of....hydroxide is preferred." and insert the same on Col. 20, Line 15 (Approx.), below "ion)" as a new paragraph.

Column 21, Line 5, change "arnines" to --amines--.

Column 22, Line 31, change "norbomane" to --norbornane--.

Column 22, Lines 47-54 (Approx.), after "C." delete "0.25 mols of a........170° C." and insert the same on Col. 22, Line 47 (Approx.), below "130°C." as a new paragraph.

Column 23, Line 43, change "norbomane" to --norbornane--.

Column 25, Line 4, in Claim 1, change "C." to --C.,--.